Nov. 20, 1962 V. D. DUNCAN 3,065,432

WIDE RANGE TUNNEL DIODE OSCILLATOR

Filed Aug. 10, 1961

INVENTOR.
VIRGIL D. DUNCAN

BY Sughrue, Rothwell, Mion, & Zinn

ATTORNEYS.

3,065,432

WIDE RANGE TUNNEL DIODE OSCILLATOR

Vigil D. Duncan, Raleigh, N. C., assignor to Capitol Broadcasting Company, Inc., Raleigh, N.C.
Filed Aug. 10, 1961, Ser. No. 130,616
2 Claims. (Cl. 332—19)

This invention relates generally to frequency modulated oscillators and more specifically to frequency modulated oscillators utilizing tunnel diodes as the active member in the oscillating circuit.

Frequency modulated oscillator circuits utilizing tunnel diodes are broadly known in the prior art. However, such oscillators are subject to the certain limitations as set out below.

One type of tunnel diode is an Esaki diode which is a heavily doped two-layer semiconductor device in which the transition from the P to the N region is very abrupt, i.e., on the order of 150 A. A particular characteristic of these diodes is that they exhibit an incremental negative resistance at a small forward D.C. bias.

These diodes are of particular interest in high frequency applications inasmuch as the tunneling phenomenon is a majority carrier effect and is not limited by transient time effects even at microwave frequencies. An interesting application of tunnel diodes is in the field of low power, ultra high frequency and microwave oscillators.

A tunnel diode can be made to oscillate by combining with it a suitable A.C. tank circuit and selecting an operating point in the negative resistance region of the diode. A discussion of the parameter requirements needed to sustain oscillations in such a device has been set out by H. S. Sommers in an article entitled "Tunnel Diodes as High Frequency Devices" and published in the Proceedings of the IRE, July 1959, vol. 47, pp. 1201–1206.

By properly combining the negative resistance characteristic of the tunnel diode with a resonant circuit, it is possible to form an efficient oscillator circuit. To establish these conditions the load line is designed to intersect the characteristic curve of the diode at only one point. This point lies in the negative resistance portion of the curve and defines an astable operating point for the circuit. If the internal resistance of the biasing source is allowed to exceed the absolute value of the negative resistance, the load line will intersect the characteristic curve of the diode at more than one point. Under such conditions the oscillating characteristics of the circuit will be lost.

A major problem in the proper design of an oscillator is instability of the frequency of oscillation and the amplitude of the output voltage. A form of instability arises from spurious low frequency oscillations which build up in the D.C. biasing circuit. Suppression of parasitic oscillations within tunnel diode oscillator circuits is of extreme importance. Such instabilities can be eliminated by designing the oscillator so that the net conductance of the bias circuit at the diode terminals exceeds the diode negative conductance. Another way of saying this is simply that the resistance of the D.C. biasing circuit must be maintained at a value lower than the absolute value of the tunnel diode negative resistance.

From the above considerations the necessity for developing and maintaining a constant D.C. biasing signal in a tunnel diode oscillator is readily apparent. Particular problems arise where the tunnel diode oscillator is frequency modulated. In this case the D.C. bias control means become extremely important since any variation in D.C. bias voltage will affect the negative conductance of the tunnel diode so as to vary the frequency of the carrier output signal and thereby induce distortions in the frequency modulated signal over and above those introduced by problems perculiar to the modulating signal.

In a frequency modulated oscillator slight changes in any of the circuit components cause vibrations in the average carrier frequency. Such an oscillator is particularly susceptible to changes in the reactance transistor or tube current which are caused by variations in the D.C. bias potential. Stabilizing means for frequency modulated oscillator systems in the past have been designed so that the carrier frequency developed by the oscillator is compared with a reference frequency generated by a crystal controlled oscillator. The output of the modulator is usually a low frequency signal which is subsequently led to a frequency multiplier which develops a final output signal of the desired higher frequency. The detection of variations in stability by the frequency comparison technique is particularly difficult in oscillators capable of operating in the kmc. range.

It is, therefore, the principal object of this invention to provide improved control means for an oscillator system which utilizes a tunnel diode as the active component in the oscillator circuit.

Another object of this invention is to provide means to control the instantaneous frequency of the tunnel diode oscillator with an applied modulating signal in a simple and economical manner.

A further object is to provide a tunnel diode oscillator which may be frequency modulated by means of any type of modulating signal, such as sine wave, sawtooth, pulse, audio or video signals.

A still further object is to provide a tunnel diode oscillator which may be frequency modulated by modulating signals having an extremely wide range of frequencies.

Another object of this invention is to provide an oscillator that can be directly frequency modulated.

Still another object of this invention is to provide a circuit that has an exceptionally wide oscillating range from a few cycles per second to several thousand megacycles.

Another object is to provide a frequency modulated oscillator having a reduced size and weight without having an adverse effect on the performance of the oscillator.

Another object is to reduce the power requirements and improve the efficiency of the frequency modulated oscillator without adversely affecting the performance thereof.

Still another object is to stabilize the frequency of a tunnel diode oscillator by controlling its supply voltage.

In accordance with the present invention, means are provided to regulate and stabilize the carrier frequency by a direct comparison of the D.C. biasing voltage signal with a reference voltage and compensating accordingly. In this manner any variation in the carrier frequency due to fluctuations in the D.C. source itself or changes in characteristics of the circuit components will be compensated. The increased efficiency provided by this stabilization permits the tunnel diode to operate over its complete spectrum of operating frequencies, thereby eliminating the need for additional frequency multiplying devices to generate a higher frequency output signal.

This invention has particular utility in the form of a frequency modulated oscillator for feeding background music into a central R.F. distribution system for TV sets or FM radio sets, one channel of which is selected to provide background music to a listener.

The various features of novelty which characterize this invention are pointed out with particularity in the appended claims. For a better understanding of the invention and its specific uses, reference should be made to the accompanying drawings and the following description to be read in connection therewith.

Briefly stated, this invention contemplates a stabilized oscillator system including an oscillator portion across which a parallel resistance-capacitance network is shunted. A D.C. bias signal is coupled to the network through a transistorized control means and means are included for detecting variations or errors in the D.C. bias and developing a compensating signal which is applied to the control means to compensate for the variations.

A preferred embodiment of this invention is in the form of a frequency modulated oscillator system including a tunnel diode as the active member in the oscillator circuit. This system is illustrated in the block diagram of FIG. 1 wherein a closely controlled, low impedance, D.C. supply potential, which also serves as primary reference potential, is applied to a control circuit in the form of a regulator-modulator 1 and also to a variation detector in the form of a differential amplifier 2 which develops a compensating signal. This compensating signal is proportional to the difference between a secondary reference potential derived from said supply potential and a D.C. bias potential which is subject to variations. The D.C. bias is derived from the said supply potential within the control circuit and is applied to an oscillator circuit 3 via a conductor 4. Any variation in the D.C. bias potential is detected by the differential amplifier 2 wherein the compensating signal is generated. The compensating signal is fed via a feedback loop to regulator-modulator 1 and is effective to stabilize the D.C. bias potential fed to the oscillator circuit.

Figure 1:
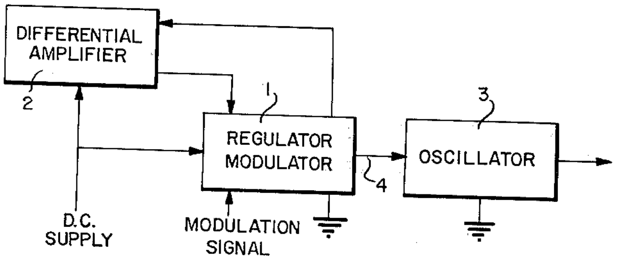
FIG. 1 is a block diagram of the essential elements comprising a frequency modulated tunnel diode oscillator constructed in accordance with this invention.
Figures 2, 3:
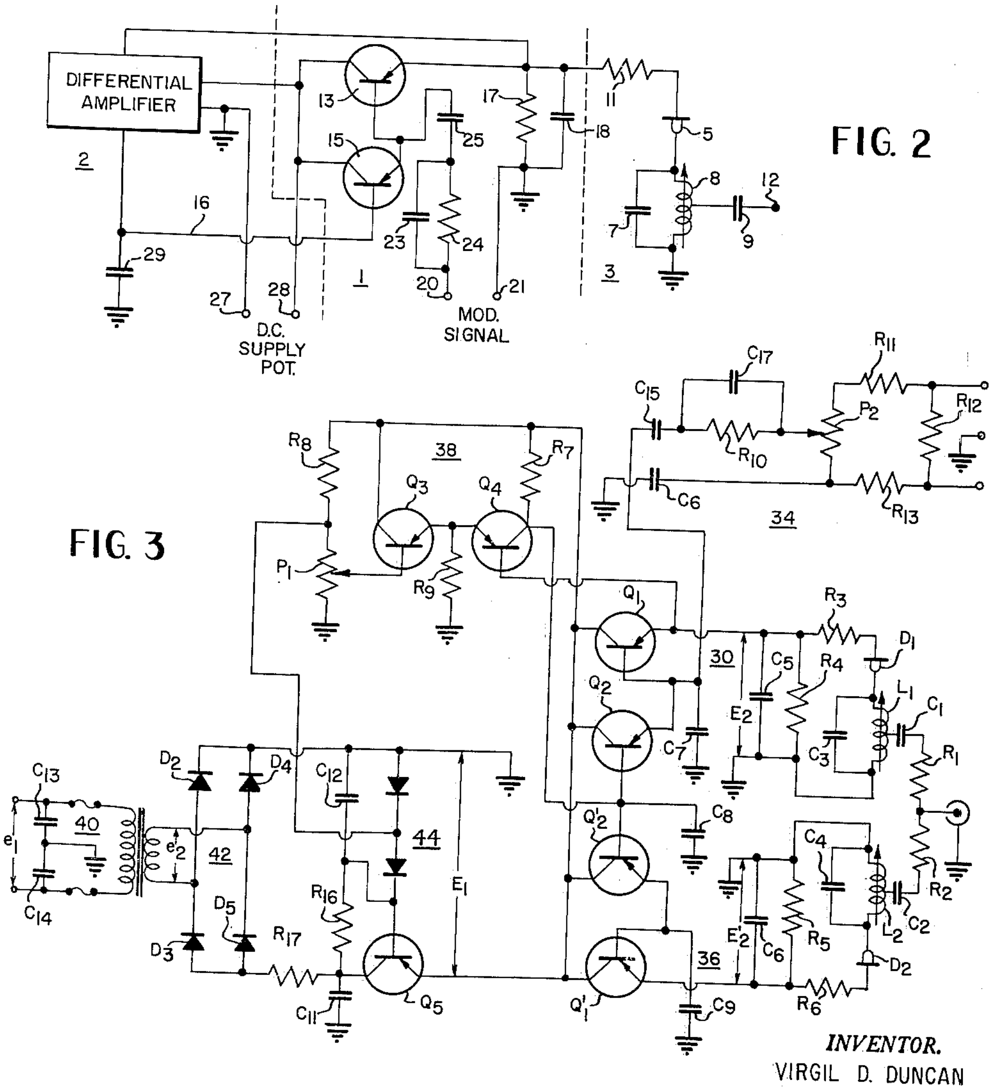
FIG. 2 is a schematic circuit diagram of the oscillator and control portions of this invention including a diagrammatic representation of the variation detection portion.
FIG. 3 is a schematic circuit diagram of the frequency modulated oscillator as utilized in one embodiment of this invention.

FIG. 2 shows a more detailed schematic diagram of the system illustrated in FIG. 1. Included in oscillator 3 is a tunnel diode 5 connected in series with a tank circuit consisting of a capacitor 7 and an inductor 8 connected in parallel. One side of the tank circuit is connected to a point of constant ground potential. The tank circuit and tunnel diode 5 constitute a complete oscillator circuit capable of producing sustained oscillation when properly biased by a D.C. potential. Inductively connected to coil 8 is a D.C. blocking capacitor 9 which couples the output to a load which may be connected to the output terminal.

Included in control circuit 1 of the system is a pair of PNP transistors 13 and 15 connected in a Darlington compound configuration. Such a configuration being required in order that the transistors operate within their desired ranges. The necessity of providing a well regulated, low impedance, D.C. bias potential to tunnel diode 5 has been set out in the introductory material. Consequently, transistor 13 is connected as an emitter-follower in shunt with resistance member 17 to present a low impedance power source to the tunnel diode. Capacitor 18 serves as a short circuit path for the A.C.-RF signal components. A modulation signal is applied to a pair of input terminals 20 and 21. Terminal 20 is connected through a preemphasis circuit consisting of a capacitance 23 and a resistance 24 connected in parallel and through a D.C. blocking capacitor 25 to the base electrode of transistor 13. Capacitor 25 prevents transistors 13 and 15 from being short circuited by the input signal network, as well as preventing any D.C. components of the input signal from affecting the regulating transistors. The purpose of the preemphasis network is to bring the relative amplitudes of all modulating signal frequencies to their proper level. A circuit diagram of differential amplifier 2 is not included in FIG. 2 inasmuch as such circuits are well known.

A pair of terminals 27 and 28 are used to connect the closely controlled D.C. supply potential to differential amplifier 2 and to the collector electrodes of transistors 13 and 15 in control circuit 1. Also associated with the differential amplifier is a feedback loop 16 which connects the variation detector portion of the system with control circuit 1. Amplifier 2 develops a compensating signal proportional to the difference between the secondary reference potential and the D.C. bias potential developed across a network consisting of resistor 17 and capacitor 18 connected in parallel. This signal is fed back via conductor 16 to the base of the transistor 15 to control the current flow therein. Located in the feedback loop 16 is a capacitor 29 which serves to filter to ground undesirable A.C. components in the feedback signal.

In the operation of the circuit of FIGURE 2, the application of a D.C. bias potential to the tunnel diode oscillating circuit 3 will result in oscillations of a predetermined frequency which is dependent upon the tunnel diode characteristics as well as those of the other circuit parameters, such as the value of the bias potential and the resonant frequency of the tank circuit. Any variation in the circuit parameters will result in a change in the output frequency developed by the oscillator. The tunnel diode oscillator is particularly sensitive to variations in the D.C. bias potential as viewed across the shunting RC network 17, 18 since a change in D.C. bias potential will result in a change in the negative conductance in tunnel diode 5 and hence a change in the operating frequency of the oscillator. To insure a constant D.C. bias and thereby stabilization of the operating frequency, a sample of the D.C. bias potential, as seen by tunnel diode 5, is fed back to the differential amplifier where it is compared with the secondary reference potential derived from the D.C. supply. Variations in the D.C. bias potential will cause the differential amplifier to develop a compensating signal which is returned to control circuit via feedback loop 16 connected to the base of transistor 15. Variations in the resultant bias at the base of transistor 15 caused by the presence of the compensating signal will result in a corresponding variation in current flow in the emitter electrode of transistor 15 and thereby a variation in the bias potential applied to the base of transistor 13. This latter bias potential controls the base current of transistor 13, thereby determining the voltage drop between the collector and emitter thereof. The correcting signal supplied by the differential amplifier and delivered to the base of the transistor 13 via transistor 15 thus is effective in maintaining a constant D.C. potential across tunnel diode oscillator 3.

An application of the above-described frequency modulated oscillator is in a system for feeding background music into a central R.F. distribution system for TV sets or F.M. radios. FIG. 3 shows such a system as utilized in a combination audio-video network.

This system consists of a first tunnel diode oscillator 30 which is frequency modulated by a signal received from the modulating signal input circuit 34. A second unmodulated tunnel diode oscillator 36 is used to generate the visual carrier. Also included in the system is a power supply capable of generating a closely controlled, low impedance D.C. supply potential. The power supply includes an A.C. input and voltage reduction system 40, a rectifying portion 42, and a potential-controlling network 44 in the form of a transistorized reactance multiplier. Also incorporated in this system is a variation detector 38 including a differential amplifier having a potentiometer P, whose setting determines the value of the secondary reference potential which is compared with the D.C. bias potential applied to oscillators 30 and 36.

Both oscillator portions are identical except as to the operating frequency. In a particular application, the visual carrier frequency was 61.25 megacycles and the audio carrier 65.75 megacycles.

A table of representative values for the various circuit components used in the system of FIG. 3 are listed below:

| Resistance in Ohms | | Capacitance in Microfarads | |
|---|---|---|---|
| $R_1$, $R_2$ | 4.7K | $C_1$, $C_2$ | .001 |
| $R_3$, $R_4$, $R_5$, $R_6$ | 27 | $C_3$ $\mu\mu$f | 47 |
| $R_7$ | 2.2K | $C_4$ $\mu\mu$f | 47 |
| $R_8$ | 680 | $C_5$, $C_6$ | .01 |
| $R_9$ | 10 | $C_7$ | .001 |
| $R_{10}$ | 7.5K | $C_8$, $C_9$ | 10 |
| $R_{11}$, $R_{13}$ | 4.7K | $C_{11}$ | 200 |
| $R_{12}$ | 560 | $C_{12}$ | 1,000 |
| $R_{16}$ | 2.2K | $C_{13}$, $C_{14}$ | .01 |
| $R_{17}$ | 27 | $C_{15}$, $C_{16}$ | 10 |
| | | $C_{17}$ | .01 |

| | |
|---|---|
| $P_1$ | 1K. |
| $P_2$ | 500. |
| $e_1$ | 110 v. A.C., 60 c./s. |
| $e_2$ | 6.3 v. A.C. |
| $E_1$ | 1.5 v. D.C. |
| $E_2$, $E_3$ | 250 mv. D.C. |
| $L_1$ | 4 turns #20 wire, ¼" diam. |
| $L_2$ | 4 turns #20 wire, ¼" diam. |
| $Q_1$, $Q_2$, $Q_{2'}$, $Q_{1'}$ | 2N1381. |
| $D_2$, $D_3$, $D_4$, $D_5$ | 1N2069. |
| $D_{T_1}$, $D_{T_2}$ | 1N2941. |
| $Q_3$, $Q_4$ | 2N1381. |
| $Q_5$ | 2N1381. |
| $D_{S_1}$, $D_{S_2}$ | G–130. |

Similar circuits have attained an operating frequency of approximately 700 megacycles. By the use of stub circuits and tuned cavities, the oscillator may be made to operate in the range of several thousand megacycles.

A preferred embodiment of this invention has been described. Other embodiments and modifications, which will be obvious to persons skilled in this art, are contemplated to be within the purview of this invention whose scope is defined in the appended claims.

What is claimed is:

1. An oscillator system comprising a semiconductor oscillator including a tunnel diode and a resonant circuit, a parallel resistance-capacitance network shunting said tunnel diode, means to supply a D.C. bias potential to said network, means to control said D.C. bias potential, said control means including a first and a second transistor each having a base electrode, said transistors being connected in common collector configuration with the emitter of the first transistor being connected to said network, means associated with said control means to detect variations in said bias potential being supplied to said network, means including a differencing circuit which compares said D.C. bias potential to a reference potential to develop a corresponding compensating signal, means for feeding said compensating signal to the base of said second transistor so as to control the emitter current thereof and thereby control the potential at the base of said first transistor thereby controlling the operating frequency of said oscillator.

2. An oscillator system comprising a semiconductor oscillator including a tunnel diode and a resonant circuit, a parallel resistance-capacitance network shunting said tunnel diode, means to supply a D.C. bias potential to said network, means to control said D.C. bias potential, said control means including a first and second transistor each having a base electrode, said transistors being connected in common collector configuration with the emitter of the first transistor being connected to said network, means associated with said control means to detect variations in said bias potential being supplied to said network, means including a differencing circuit which compares said D.C. bias potential to a reference potential to develop a corresponding compensating signal, means for feeding said compensating signal to the base of said second transistor so as to control the emitter current thereof and thereby control the potential at the base of said first transistor thereby controlling the operating frequency of said oscillator and means for feeding a modulating signal to the base of said first transistor.

References Cited in the file of this patent

UNITED STATES PATENTS

| | | |
|---|---|---|
| 2,771,584 | Thomas | Nov. 20, 1956 |
| 2,984,794 | Carter et al. | May 16, 1961 |
| 3,003,120 | Greefkes | Oct. 3, 1961 |
| 3,041,552 | Adamthwaite et al. | June 26, 1962 |